United States Patent
Ni

(10) Patent No.: US 7,772,861 B2
(45) Date of Patent: Aug. 10, 2010

(54) PROBE CARD

(75) Inventor: Cheng-Chin Ni, Hsin-Chu (TW)

(73) Assignee: King Yuan Electronics Co., Ltd, Hsin-Chu (TW)

( * ) Notice: Subject to any disclaimer, the term of this patent is extended or adjusted under 35 U.S.C. 154(b) by 1 day.

(21) Appl. No.: 12/259,249

(22) Filed: Oct. 27, 2008

(65) Prior Publication Data

US 2010/0052710 A1    Mar. 4, 2010

(30) Foreign Application Priority Data

Aug. 27, 2008  (TW) .............................. 97132689 A

(51) Int. Cl.
*G01R 31/02* (2006.01)

(52) U.S. Cl. ...................................... 324/754; 324/762
(58) Field of Classification Search ......... 324/750–755, 324/158.1; 361/767, 782, 770
See application file for complete search history.

(56) References Cited

U.S. PATENT DOCUMENTS

| 5,917,707 | A * | 6/1999 | Khandros et al. ............ 361/776 |
| 2004/0207420 | A1* | 10/2004 | Cheng et al. ................. 324/755 |
| 2006/0158206 | A1* | 7/2006 | Boll et al. .................... 324/754 |

* cited by examiner

*Primary Examiner*—Minh N Tang
*Assistant Examiner*—Trung Q Nguyen
(74) *Attorney, Agent, or Firm*—Stout, Uxa, Buyan & Mullins, LLP

(57) ABSTRACT

The present invention discloses a probe card for testing a wafer. The probe card comprises a printed circuit board for transmitting test signals, a fastened ring arranged at the downside of the printed circuit board, and a plurality of needles passing through the fastened ring, each needle having one end connecting to circuits of the printed circuit board, and having a tip portion at the other end connecting to a pad of the wafer, where each needle has at least one bent portion between the fastened ring and the tip portion, to absorb stress between the needle and the pad.

4 Claims, 4 Drawing Sheets

PROBE CARD

BACKGROUND OF THE INVENTION

1. Field of the Invention

The present invention relates to a probe card, and more particularly, to a probe card having less contact stress applied to the wafer.

2. Description of the Prior Art

For testing high density and high-speed electrical elements such as large-scale integrated (LSI) and very large-scale integrated (VLSI) circuits, a probe card is commonly employed. The probe card includes tiny, precise contact structures to contact with dies on a wafer, thus to establish an electric connection for carrying out the test.

FIG. 1 shows a conventional test system of probe card. A semiconductor test system 10 sends out test signals through a cable 11 to a tester 12. The test signals are transmitted to a load board 13 later. The load board 13 transmits the test signals to a probe card 14. The probe card 14 transmits the test signals to a plurality of tiny, precise contact sites 15. A handler 17 bears a wafer 16 for establishing an electric connection between the contact sites 15 and dies (not shown) on the wafer 16 by moving the handler 17, such that the dies on the wafer 16 receive the test signals for carrying out the test. When the test is finished, the contact sites 15 receive the test result and send it back to the semiconductor test system 10 through a reverse path as mentioned above.

Referring to FIG. 2, Taiwan Patent issued no. 00587699, entitled "Probe Card having a Fixed Ring," discloses a conventional probe card. A probe card 20 comprises a fixed ring 21, a circuit board (not shown) arranged on the top surface of the fixed ring 21, an isolated ring 22 arranged on the bottom surface of the fixed ring 21, where a plurality of contact pins 23 having the same pitch with one another pass through the isolated ring 22. Each contact pin 23 includes a tip portion 24 directing downward, and the tip portion 24 corresponds to the contact sites 15 as mentioned above. The tip portion 24 will electrically connect to a pad (not shown) of the dies of the wafer for carrying out the test.

When the tip portion 24 contacts the pad, generally probe marks will be generated due to a contact stress; however, if the contact stress applied to the pad is too large, the probe marks will exceed the range within the pad and thus harm the die. In addition, the exceeding contact stress may damage the circuit or semiconductor region of the die under the pad, causing the die to be defective, and consequently the test result fails.

Therefore, it would be advantageous to provide a novel probe card that overcomes the defects of the prior art.

SUMMARY OF THE INVENTION

An object of the present invention is to provide a novel probe card for reducing the contact stress, reducing probe marks, and avoiding damage to the circuit or semiconductor region of the dies.

According to the object, the present invention provides a probe card, which comprises a printed circuit board for transmitting test signals, a fastened ring arranged below the printed circuit board, and a plurality of needles passing through the fastened ring, each of the plurality of needles including one end for connecting with a circuit of the printed circuit board and including a tip portion at the other end for connecting a pad of the wafer, wherein each needle comprises a bent portion between the fastened ring and the tip portion to absorb most of contact stress applied to the pad of the wafer.

DESCRIPTION OF THE PREFERRED EMBODIMENT

The detailed description of the present invention will be discussed in the following embodiments, which are not intended to limit the scope of the present invention, but can be adapted for other applications. While drawings are illustrated in detail, it is appreciated that the quantity of the disclosed components may be greater or less than that disclosed, except expressly restricting the amount of the components. Wherever possible, the same or similar reference numbers are used in drawings and the description to refer to the same or like parts. It should be noted that any drawings presented are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawing. Such directional terms should not be construed to limit the scope of the invention in any manner.

Figure 1:
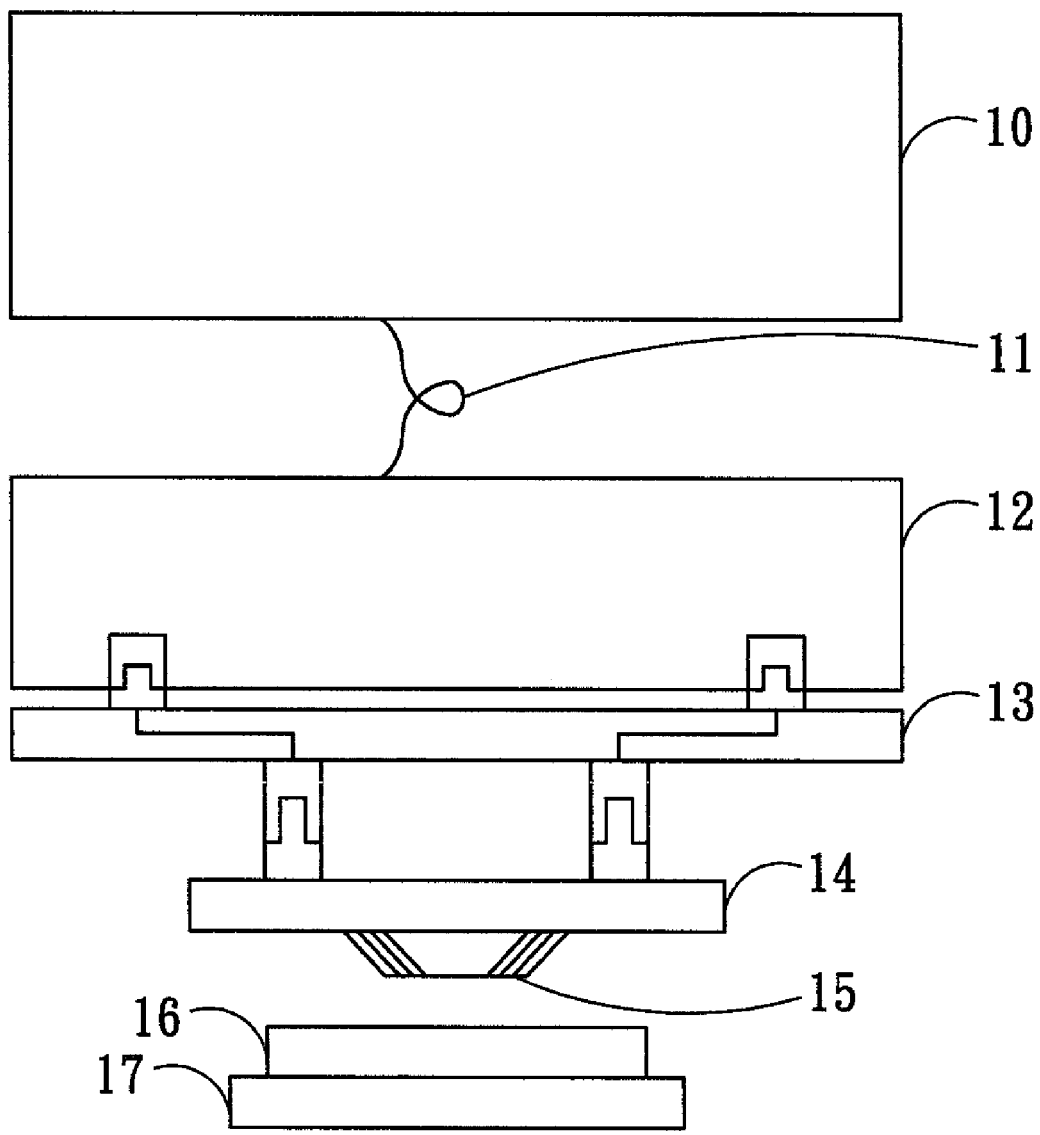
FIG. 1 shows a conventional test system of probe card.
Figure 2:
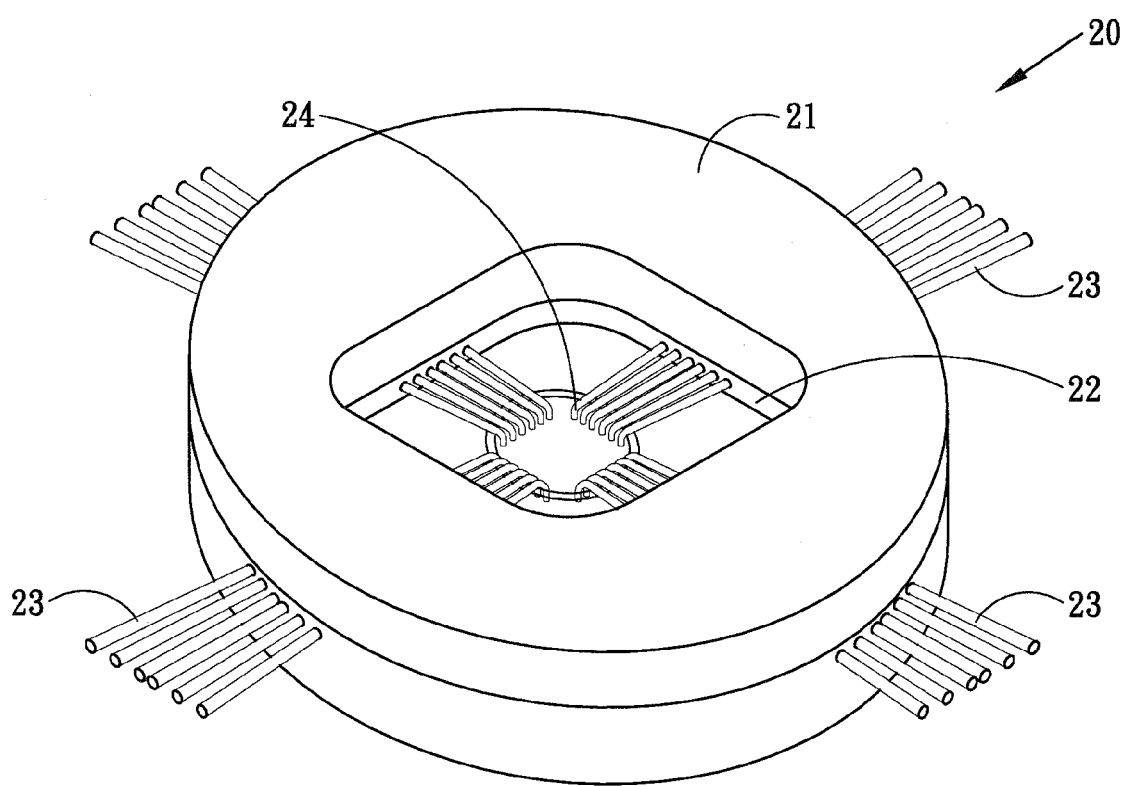
FIG. 2 shows a conventional probe card.
Figure 3:
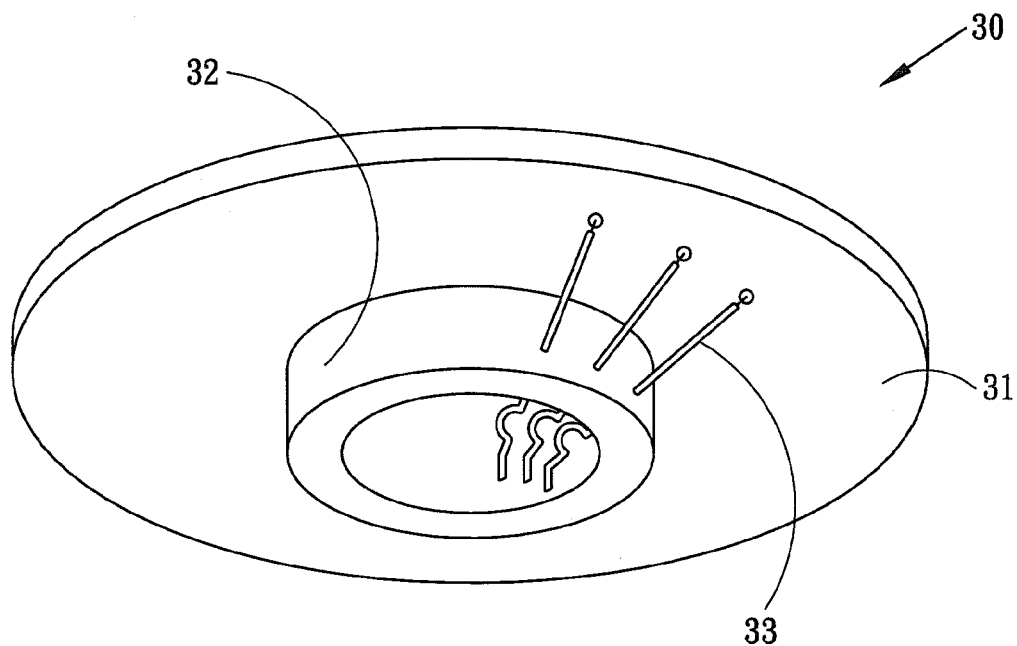
FIGS. 3-5 illustrate embodiments of the probe card according to the present invention.
Figure 4:
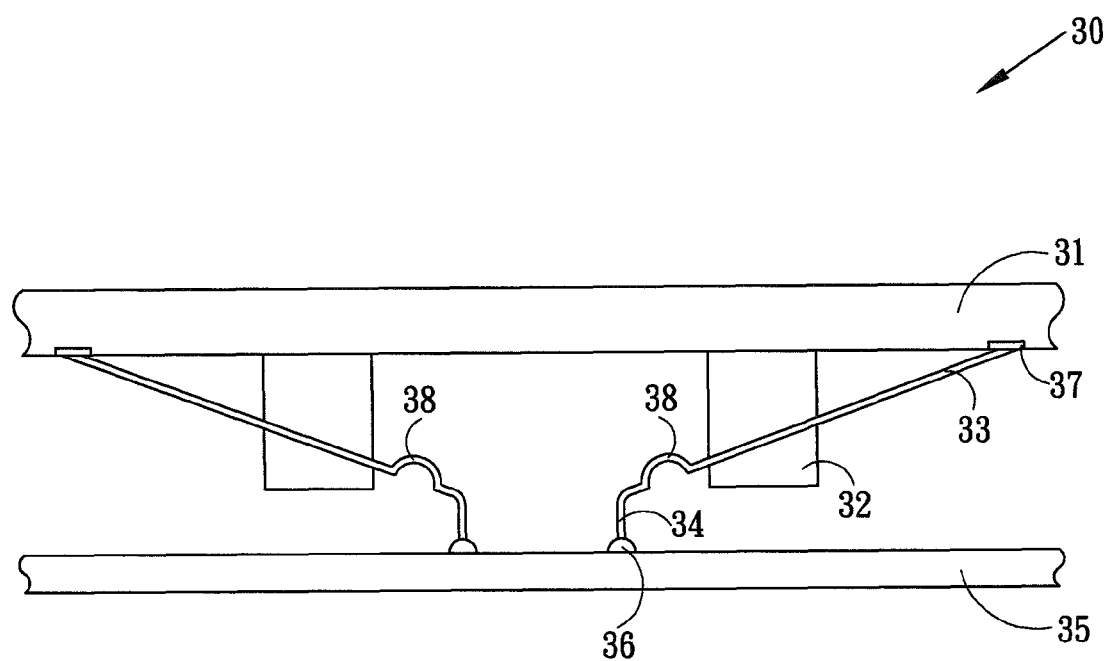
Figure 5:
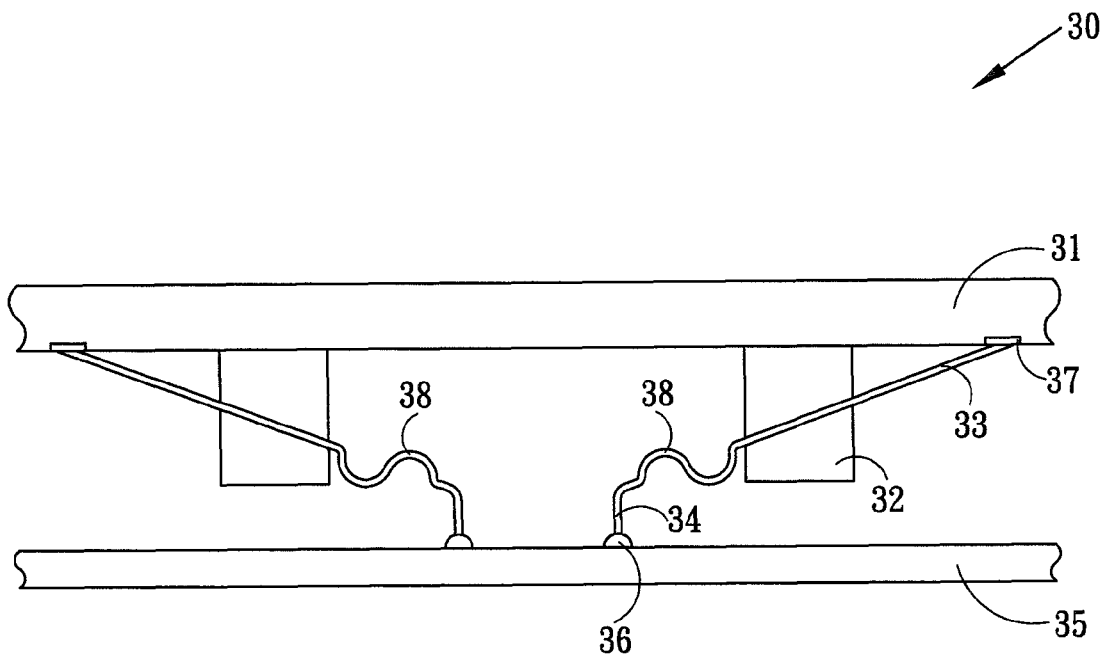

FIGS. 3-5 illustrate embodiments of probe card according to the present invention, where FIG. 3 shows a front view and FIGS. 4-5 show a side view. A probe card 30 comprises a printed circuit board 31 for transmitting test signals, a fastened ring 32 arranged below the printed circuit board 31, and a plurality of needles 33 pass through the fastened ring 32, where the fastened ring 32 can be circular, rectangular, or any other shape, and each of the plurality of needles 33 including one end for connecting with a circuit 37 of the printed circuit board 31 and including a tip portion 34 at the other end for connecting a pad 36 of a die (not shown) of a wafer 36, such that a test can be carried out.

In addition, each needle 33 includes a bent portion 38 between the fastened ring 32 and the tip portion 34 to absorb most or a majority of contact stress applied to the pad 36 of the wafer 35, consequently achieving the object of reducing the contact stress, reducing probe marks, and avoiding damage to the circuit or semiconductor region of the dies. According to the present invention, the bent portion 38 may comprise one arc having a center and a bend radius, as shown in FIG. 4; according to the present invention, the bent portion 38 may comprise two arcs and each arc has a center and a bend radius, as shown in FIG. 5. According to the present invention, the bent portion 38 comprises at least one arc and each arc has a center and a bend radius.

It is appreciated that the definition of the bent portion 38 between the fastened ring 32 and the tip portion 34, does not comprise the arc for forming the tip portion 34 to direct downward. In addition, according to the present invention, the bent portion 38 may comprise at least one arc having the same or different bent radius. As shown in FIG. 5, the bent portion 38 comprises two inverse arcs to equally absorb contact stress applied to the pad.

In addition, the probe card 30 may comprise other fastened elements arranged between the printed circuit board 31 and the fastened ring 32. The fastened ring 32 may be made of polymer, such as epoxy or the like. To the exclusion of purely electrical insulating material, the fastened ring 32 typically should comprise some type of electrical conducting material. For example, the electrical conducting material may comprise electrical conducting polymer.

Figure 6:
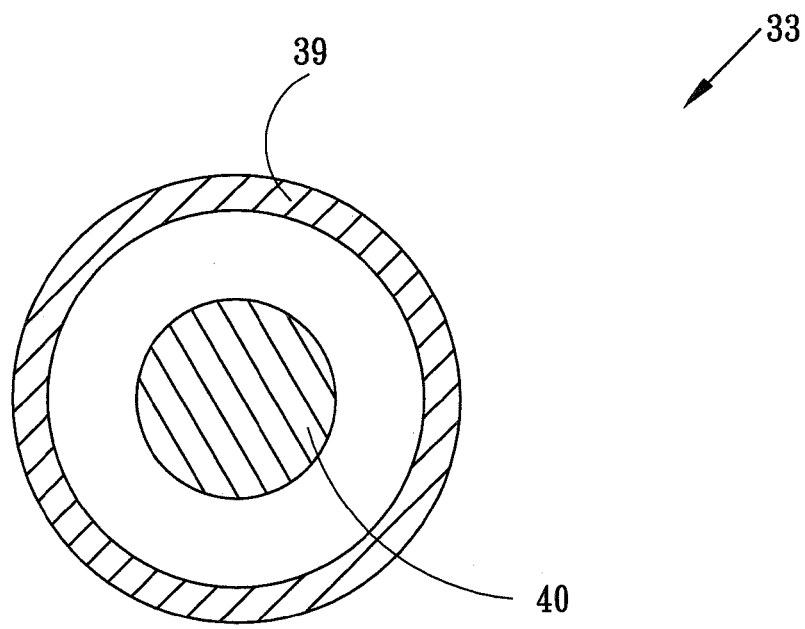
FIGS. 6-7 illustrate embodiments of needle of the probe card according to the present invention.
Figure 7:
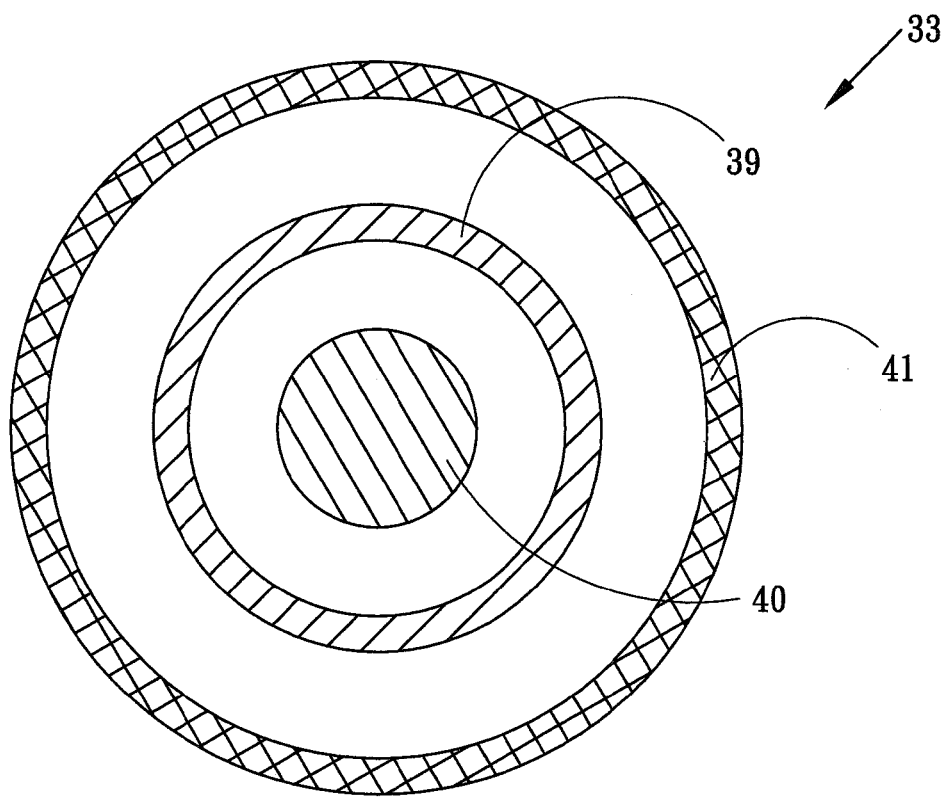

FIGS. 6-7 illustrate two embodiments of the needle 33 of the probe card 30 according to the present invention. FIG. 6 shows the needle 33 comprising a metal core 40 and an insulating cladding 39, where the metal core 40 is enclosed in the insulating cladding 39. The metal core 40 may be made of alloy of beryllium and copper (BeCu), tungsten (W), or any other metal or alloy. FIG. 7 shows the needle 33 of the probe card 30 further comprising a shielding 41 that encloses the insulating cladding 39. The shielding 41 is preferably made of metal for reducing signal crosstalk and coupling between needles 33. Moreover, if the fastened ring 32 is made of electric conducting polymer, at least some of the needles 33, for example those connected to a ground circuit, in which the shielding 41 may electrically connect to the fastened ring 32, such that the grounding path and induction loop can be reduced, and thus stabilize the test signals.

As the embodiments disclosed herein, the probe card according to the present invention has overcome the defects of prior art. The present invention has advantages including: reducing the contact stress; reducing probe marks; avoiding damage to the circuit or semiconductor region of the dies; and stabilizing the test signals.

Although specific embodiments have been illustrated and described, it will be appreciated by those skilled in the art that various modifications may be made without departing from the scope of the present invention, which is intended to be limited solely by the appended claims.

What is claimed is:

1. A probe card for testing a wafer, comprising:
a printed circuit board configured to transmit test signals;
a fastened ring, arranged below said printed circuit board; and
a plurality of needles passing through said fastened ring, each of the plurality of needles including one end for connecting with a circuit of said printed circuit board and including a tip portion at the other end for connecting to a pad of the wafer;
wherein each needle comprises a bent portion between said fastened ring and said tip portion to absorb most or a majority of contact stress applied to the pad of the wafer, said fastened ring is made of a material comprising electrical conducting polymer, said plurality of needles comprises a metal core, an insulating cladding enclosing the metal core, and a metal shielding enclosing the insulating cladding, and the metal shielding electrically connects to said fastened ring, such that the grounding path and induction loop can be reduced.

2. The probe card as recited in claim 1, wherein said bent portion comprises one arc having a center and a bent radius.

3. The probe card as recited in claim 1, wherein said bent portion comprises two arcs, each of the two arcs having a center and a bent radius.

4. The probe card as recited in claim 1, wherein said plurality of needles is made of a material comprising an alloy of beryllium and copper (BeCu), or tungsten (W).

* * * * *